CURRENT LIMITER EMPLOYING FIELD EFFECT DEVICES

Filed March 29, 1966

INVENTOR
ARDEN J. WOLTERMAN

BY Sughrue, Rothwell, Mion, Zinn & Macpeak
ATTORNEYS

United States Patent Office 3,369,129
Patented Feb. 13, 1968

3,369,129

CURRENT LIMITER EMPLOYING FIELD EFFECT DEVICES

Arden J. Wolterman, Apalachin, N.Y., assignor to International Business Machines Corporation, Armonk, N.Y., a corporation of New York Filed Mar. 29, 1966, Ser. No. 538,262
2 Claims. (Cl. 307—237)

ABSTRACT OF THE DISCLOSURE

A current limiter comprising two field effect transistors having their drain-source paths connected in series and the remaining terminal of each transistor resistively connected to the gate terminal of the other transistor. The voltage drop across one transistor reverse biases a gate diode of the other transistor to produce a current saturation at a certain input voltage level.

This invention relates in general to a current limiting device and more particularly to a novel, electronic current limiter employing field effect transistors.

One of the most useful features of field effect transistors is their saturation or pinch-off characteristic at certain drain-source voltage levels of the proper polarity. A description of this phenomenon may be found in the text of Transistor Technology, vol. II, D. Van Nostrand Company, Inc., 1958, on pages 518–531. This characteristic renders field effect transistors particularly adaptable to current limiting applications.

It is therefore a primary object of this invention to provide a current limiter employing field effect transistors.

It is a further object of this invention to provide such a current limiter which is effective for both A.C. signals and for D.C. signals of either polarity.

It is a further object of this invention to provide such a current limiter which includes biasing means for the gate-source junctions to substantially decrease the current saturation level.

Figure 1:
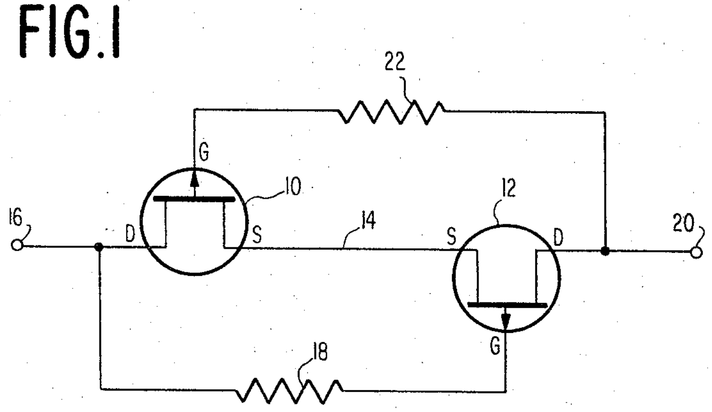
Figure 2:
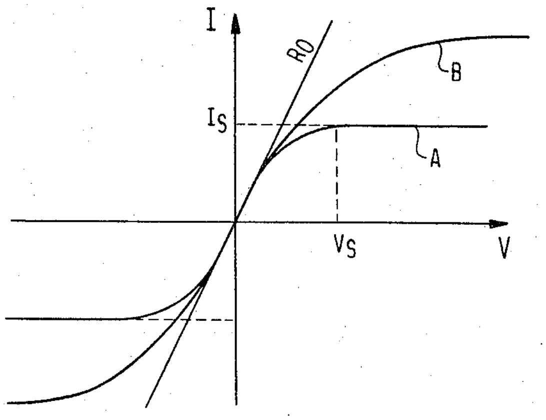

The foregoing and other objects, features and advantages of the invention will be apparent from the following more particular description of a preferred embodiment of the invention, as illustrated in the accompanying drawings, in which:

FIGURE 1 shows a schematic circuit diagram of a current limiter constructed in accordance with the teachings of this invention, and FIGURE 2 shows a coordinate plot of the voltage-current characteristic for the current limiter of FIGURE 1.

Referring now to the drawings, FIGURE 1 shows a first field effect transistor 10 and a second field effect transistor 12 having their source terminals directly connected to each other by line 14. A first input/output terminal 16 is connected to the drain terminal of transistor 10 and, through a resistor 18, to the gate terminal of transistor 12. Similarly, a second input/output terminal 20 is connected to the drain terminal of transistor 12, and, through a resistor 22, to the gate terminal of transistor 10. Assuming that the same saturation point is desired for current flowing in either direction, resistors 18 and 22 will have equal values. While their actual parameters will depend on the characteristics of the transistors employed, they must be large enough to keep the current through them at a relatively low level and yet sufficiently small to reduce voltage drops due to junction leakage currents to a minimum.

Considering the operation of the device, which will be explained in conjunction with the characteristic curve shown in FIGURE 2, assume that a positive potential is applied to terminal 16 and terminal 20 is grounded. Current will then begin to flow from left to right in FIGURE 1 with the initial resistance of the device being represented by the straight line $R_0$ in FIGURE 2.

Since the gate of transistor 10 is tied to ground through resistor 22 and the drain is at the level of the positive input potential, the pn junction in transistor 10 is forward biased. Current therefore flows through the gate diode, but this current is limited by resistor 22. The bulk of the current flows from the drain to the source, in the normal conductive channel, and produces a corresponding IR drop in transistor 10. This IR drop reverse biases the gate diode of transistor 12, whose gate is tied to the input potential level through resistor 18, and creates a channel pinching space charge region in transistor 12. As the input potential is increased, the space charge region in transistor 12 expands and narrows or pinches the conduction channel until, at a potential of $V_s$, the conduction channel is completely saturated at a current level of $I_s$. Further voltage increases will have no effect on the current, as seen from operating curve A in FIGURE 2.

It should be noted that if the gate of transistor 12 was tied directly to its source, thereby bypassing the IR drop across transistor 10, saturation would occur at a substantially higher voltage and current level, as indicated by curve B in FIGURE 2. It can thus be seen that the circuit arrangement of FIGURE 1 utilizes the drain source voltage drop of transistor 10 to reverse bias the gate-source junction of transistor 12 and produce a lower saturation or limiting point. Experimental results have shown that the saturation current $I_s$ for curve A is approximately 0.6 of that for curve B.

If the input connections are reversed, i.e., terminal 16 is grounded and a positive potential is applied to terminal 20, transistor 12 will conduct to produce the biasing drop and transistor 10 will saturate the circuit operation being the converse of that described above. It will thus be understood that the circuit of FIGURE 1 is effective to limit both D.C. currents of either polarity or A.C. currents. In the latter case the two transistors alternately saturate during successive half cycles of the input signal. It will also be apparent that opposite conductivity type transistors may be employed, i.e., ones having n type bodies and p type gates. In such a case transistor 10 would saturate for positive signals higher than $V_s$ applied to terminal 16. Although the circuit diagram of FIGURE 1 shows the source terminals of the two transistors connected together, this arrangement is somewhat arbitrary since in many field effect transistors the source and drain terminals are interchangeable. The source terminal is merely the one supplying electrons and the drain terminal is the one removing them. For symmetrical field effect transistors of this type the drain and source terminals are more aptly designated merely input/output terminals.

While the invention has been particularly shown and described with reference to a preferred embodiment thereof, it will be understood by those skilled in the art that various changes in form and details may be made therein without departing from the spirit and scope of the invention.

What is claimed is:

1. A current limiter comprising:

(a) a pair of terminals adapted to be connected to a source of current to be limited, (b) a pair of field effect transistors each having two input/output terminals and a gate terminal, (c) means directly connecting together an input/output terminal from each transistor, said means having no other connections intermediate the input/output terminals, (d) means connecting the remaining input/output terminal of each transistor to the gate terminal of the other transistor, and (e) means individually connecting the remaining input/output terminals to the pair of terminals, whereby current flow through the two transistors causes a voltage drop across one of the transistors which reverse biases the other transistor to create a space charge region, which in turn expands as the current is increased and narrows the conduction channel until the latter is saturated, thereby limiting the current.

2. A current limiter as defined in claim 1 wherein the means recited in sub-paragraph (d) comprises a pair of resistors each connected in series between the remaining input/output terminal of one of the transistors and the gate terminal of the other transistor.

References Cited

UNITED STATES PATENTS

| | | | |
|---|---|---|---|
| 3,134,912 | 5/1964 | Evans | 307—88.5 |
| 3,210,677 | 10/1965 | Lin et al. | 307—88.5 |

ARTHUR GAUSS, *Primary Examiner.*

R. H. EPSTEIN, J. ZAZWORSKY, *Assistant Examiners.*